(12) United States Patent
Ota et al.

(10) Patent No.: US 9,550,238 B2
(45) Date of Patent: Jan. 24, 2017

(54) REPLACEABLE MACHINING HEAD

(71) Applicant: MITSUBISHI MATERIALS CORPORATION, Tokyo (JP)

(72) Inventors: Yasushi Ota, Akashi (JP); Taro Abe, Akashi (JP); Yuki Matsuoka, Akashi (JP); Takayuki Azegami, Akashi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/775,932

(22) PCT Filed: Mar. 3, 2014

(86) PCT No.: PCT/JP2014/055290
§ 371 (c)(1),
(2) Date: Sep. 14, 2015

(87) PCT Pub. No.: WO2014/141917
PCT Pub. Date: Sep. 18, 2014

(65) Prior Publication Data
US 2016/0031018 A1    Feb. 4, 2016

(30) Foreign Application Priority Data

Mar. 14, 2013 (JP) ................. 2013-052241

(51) Int. Cl.
*B23C 5/10* (2006.01)
*C23C 30/00* (2006.01)

(52) U.S. Cl.
CPC .............. *B23C 5/10* (2013.01); *C23C 30/005* (2013.01); *B23C 2210/02* (2013.01);
(Continued)

(58) Field of Classification Search
CPC ............. B23C 2210/02; B23C 2210/03; B23C 2228/08; B23C 2228/10; B23C 2240/32; C23C 30/005; B23B 27/14; B23B 27/148; Y10T 407/27; Y10T 408/78; Y10T 408/95
(Continued)

(56) References Cited

U.S. PATENT DOCUMENTS

| 5,656,383 | A | * | 8/1997 | Tanaka | ................ C23C 14/0664 428/627 |
| 2002/0071949 | A1 | * | 6/2002 | Liu | .......................... B23C 5/10 428/325 |

(Continued)

FOREIGN PATENT DOCUMENTS

| JP | 2001-252815 A | 9/2001 |
| JP | 2010-284752 A | 12/2010 |

(Continued)

OTHER PUBLICATIONS

International Search Report mailed May 20, 2014, issued for PCT/JP2014/055290.
(Continued)

*Primary Examiner* — Daniel Howell
*Assistant Examiner* — Nicole N Ramos
(74) *Attorney, Agent, or Firm* — Locke Lord LLP

(57) ABSTRACT

Provided is a replaceable machining head wherein: fractures on the tool attaching portion do not occur; the production cost is minimized; the tool life of the working tool will be lengthened; and the head body is free from a risk of falling off during replacement. In the replaceable machining head, a cutting edge section is formed on the front side of a head body; a tool attaching portion to which a working tool is to be attached, is formed on the rear end side of the cutting edge section; tool attaching faces are formed in the tool attaching portion; the surface of the head body 1 is coated with a coating film; and the number of droplets or macro particles having convex shapes with a size of 0.3 μm to 5.0

(Continued)

μm, is 200 or less, per area of 40 μm×60 μm on the surface of the coating film over the tool attaching faces.

1 Claim, 1 Drawing Sheet

(52) U.S. Cl.
CPC ...... *B23C 2210/03* (2013.01); *B23C 2228/10* (2013.01); *B23C 2240/32* (2013.01); *Y10T 407/27* (2015.01); *Y10T 408/78* (2015.01); *Y10T 408/95* (2015.01)

(58) Field of Classification Search
USPC .......................................... 428/325; 202/102
See application file for complete search history.

(56) References Cited

U.S. PATENT DOCUMENTS

| | | | | |
|---|---|---|---|---|
| 2003/0049083 A1* | 3/2003 | Ohtani | .................. | C23C 14/022 408/144 |
| 2003/0164597 A1* | 9/2003 | Kimura | .................. | B23B 31/06 279/89 |
| 2004/0076857 A1* | 4/2004 | Sjolen | .................... | B82Y 30/00 428/701 |
| 2004/0253379 A1* | 12/2004 | Sugita | .................... | B23B 51/02 427/355 |
| 2008/0075543 A1* | 3/2008 | Zhu | ........................ | B23B 27/14 407/119 |
| 2009/0169910 A1* | 7/2009 | Myrtveit | ............... | C23C 14/022 428/545 |
| 2010/0135737 A1* | 6/2010 | Fukano | .................. | C23C 16/34 407/115 |
| 2010/0247263 A1 | 9/2010 | Azegami et al. | | |
| 2012/0093602 A1 | 4/2012 | Osawa et al. | | |
| 2013/0177361 A1* | 7/2013 | Waki | .................... | C23C 14/0664 407/115 |

FOREIGN PATENT DOCUMENTS

| | | |
|---|---|---|
| JP | 2011-143532 A | 7/2011 |
| JP | 2011-183545 A | 9/2011 |

OTHER PUBLICATIONS

Supplementary European Search Report dated Dec. 1, 2016, issued for the European patent application No. 14762271.6.

* cited by examiner

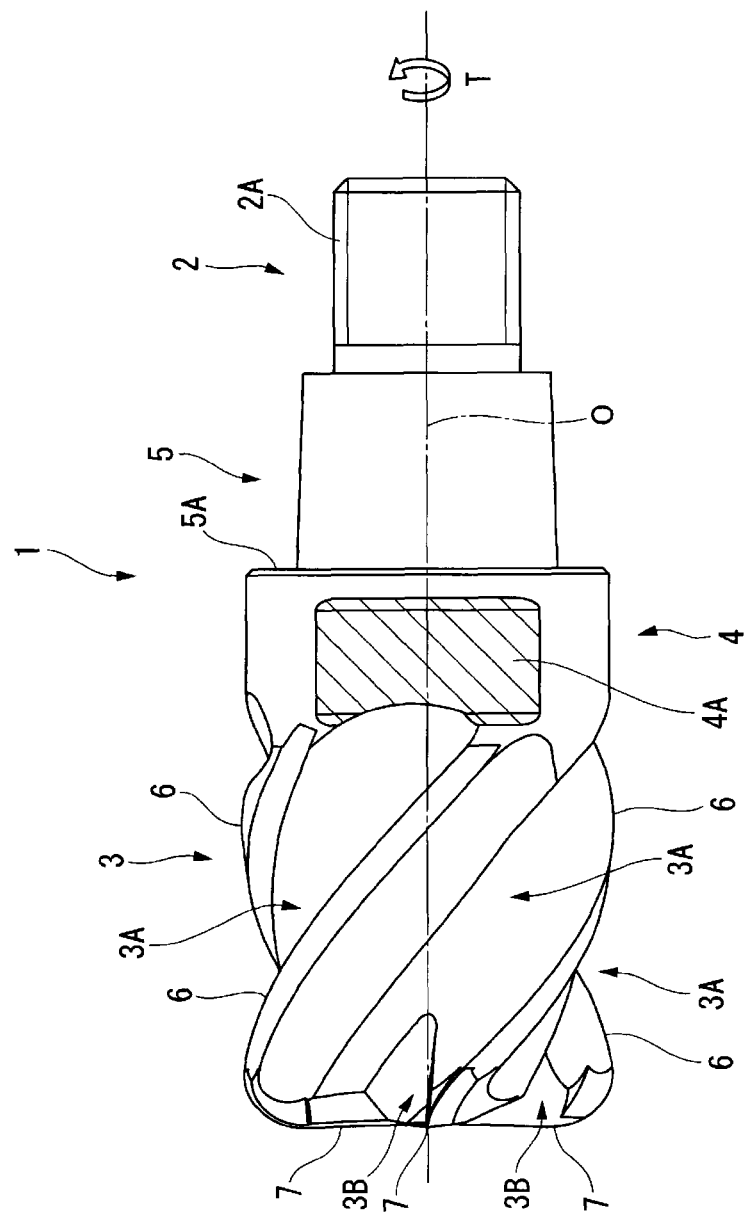

REPLACEABLE MACHINING HEAD

TECHNICAL FIELD

The present invention relates to a replaceable machining head which is attachable to and detachable from the front end of a tool body, and is used for machining.

BACKGROUND ART

As a machining tool with such a replaceable machining head mounted on the tool body, for example, Patent Document 1 discloses a machining head replaceable rotating tool. In this tool, a male screw for fastening and a female screw for fastening are provided coaxially on one and the other of a machining head (replaceable machining head) and a holder (tool body) to screw them together; and then the machining head is attachably and detachably mounted coaxially on the front end of the holder.

Here, in the machining head replaceable rotating tool described in Patent Document 1, the machining head and the holder each have an abutting face where they abut each other in a fastened state so that the male screw for fastening and the female screw for fastening are screwed together. The machining head performs predetermined machining by rotating the machining head mounted on the holder as one unit in a rotational direction in which the male screw for fastening and the female screw for fastening are screwed into each other by a rotational machining load. Further, both abutting surfaces on which they abut prevent the male screw for fastening and the female screw for fastening from being screwed too tightly by the rotational machining load.

Patent Document 1 also describes that the body of the replaceable machining head has a tool locking portion (attaching portion) in which a working tool such as a wrench is to be locked, for screwing the male screw for fastening and the female screw for fastening together. The tool locking portion has a pair of parallel flat tool locking faces (attaching faces) shaped as two chamfer parts, which are symmetrical with respect to the axis. Further, Patent Document 1 describes that, according to the kind of tool used, the head body includes such components as cutting edges, and is made of a designated tool material, for example, cemented carbide or high-speed steel. Also, as the need arises, the head body can be coated with a coating film such as a compound film coating, for example TiN, TiCN, TiAlN, CrN, etc., or a hard film coating, for example DLC film, diamond coating, etc.

PRIOR ART

Patent Documents

[Patent Documnet 1] Japanese Unexamined Patent Application Publication JP 2010-284752A

SUMMARY OF INVENTION

Technical Problems

Regarding the replaceable machining head mentioned in Patent Document 1, the surface of the head body is coated with a coating film of TiN, TiCN, TiAlN, CrN, etc. When coating the surface of the head body with such a coating film, tool attaching faces of the tool attaching portion to which the working tool is to be attached, are also coated with the coating film. However, in a case of forming the coating film by an arc ion plating method, it is well known that there will be droplets or macro particles having convex shapes, with a size of about 0.3 μm to 5.0 μm, on the surface of the coating film.

Further, such droplets or macro particles are 'hard', the same as the coating film. Therefore, whenever a working tool such as a wrench is attached to the tool attaching portion for replacing the head body, the working tool is repeatedly worn by the droplets or the macro particles. Thus, there is a risk that the tool life becomes shorter. Further, when attaching the working tool to the tool attaching portion, a high level of friction arising between them causes the head body to be pushed out. In this case, the head body falls off from the tool body before fixing them to each other, and there is also a risk that a cutting edge suffers damage such as fractures.

On the other hand, if the tool attaching faces are not coated with the coating film, the material of the head body is 'hard', the same as the aforementioned cemented carbide or high-speed steel, but such materials are also breakable. When attaching a working tool such as a wrench to the head body made of such materials, fractures can easily occur. Further, in order to prevent the tool attaching faces from being coated with the coating film during the coating, some kind of protective covering has to be applied on the tool attaching faces beforehand. Therefore, the necessary time and preparation work for coating increase, and the production costs also increase.

This invention was made in light of the aforementioned background and aims to provide a replaceable machining head wherein: fractures on the tool attaching portion do not occur; the production costs are minimized; the tool life of the working tool is lengthened; and the head body is free from risk of falling off during replacement.

Technical Solution

In order to solve the aforementioned problems and also to accomplish these aims, a replaceable machining head of the present invention comprises the following features:

a cutting edge section which is formed on the front side of a head body;

a tool attaching portion to which a working tool is to be attached, and which is formed on the rear end side of the cutting edge section; and tool attaching faces which are formed in the tool attaching portion, wherein the surface of the head body is coated with a coating film, and the number of droplets or macro particles having convex shapes with a size of 0.3 μm, to 5.0 μm, is 200 or less, per area of 40 μm×60 μm on the surface of the coating film over the tool attaching faces.

Thus, in the replaceable machining head with the aforementioned structure, the number of droplets or macro particles having convex shapes with a size of 0.3 μm to 5.0 μm, is lowered to 200 or less, per area of 40 μm×60 μm on the surface of the coating film over the tool attaching faces. Therefore, wear of a working tool such as a wrench caused by the droplets or the macro particles is able to be minimized. Further, since friction with the droplets or the macro particles is the tool attaching faces become sufficiently smooth so as to be able to slide the working tool thereinto, and the head body is prevented from falling off during replacement. Furthermore, although the number of droplets or macro particles is small, the coating film covering the tool attaching faces can protect them from damage such as fractures when attaching the working tool thereto.

Here, if the number of droplets or macro particles having convex shapes with a size of 0.3 μm to 5.0 μm, is 200 or higher, per area of 40 μm×60 μm on the surface of the coating film over the tool attaching faces, it is difficult to minimize wear of the working tool and to entirely prevent the head body from falling off. Further, in order to reduce the number of droplets or macro particles having convex shapes with a size of 0.3 μm to 5.0 μm, to 200 or less, per area of 40 μm×60 μm on the surface of the coating film over the tool attaching faces, the tool attaching faces should be polished after the coating work. Also, by polishing the cutting edge section and the tool attaching faces concurrently, the labor and time for production can be reduced and thus the cost can also be prevented from increasing.

Advantageous Effects

As in the aforementioned explanations, a replaceable machining head of the present invention enables a working tool such as a wrench, used for replacing the head body, to have its tool life extended without any fractures on the tool attaching faces and without raising the production costs. Further, the invention can also prevent the head body from falling off during replacement, and thus the cutting edges become free from damage such as fractures caused by the falling off.

BRIEF DESCRIPTION OF DRAWING

FIG. 1 is a side view of an embodiment of the present invention.

DESCRIPTION OF EMBODIMENTS

FIG. 1 shows one embodiment of the present invention. In this embodiment, a replaceable machining head comprises:
head body 1 made from a hard material such as cemented carbide, and integrally formed as a single unit; and
a connection member 2 made from a metal material such as steel, with a lower hardness than that of the head body 1, and integrally formed as a single unit.

The head body 1 is provided with, in order from the front end side (left side in FIG. 1) to the rear end side (right side in FIG. 1), a cutting edge section 3, a tool attaching portion 4 and a mounting portion 5. Further, the connection member 2 is provided with a screw portion 2A which projects from the mounting portion 5 toward the rear end side.

The cutting edge section 3 of the head body 1 has an almost columnar shape around an axis O as the center axis thereof. In the periphery of the cutting edge section 3, from its front end toward the rear end side, two or more flutes 3A, four in this embodiment, are formed with a helical shape handed to the trailing side in the tool rotational direction T, are located along the circumference and are evenly spaced away from each other. Peripheral cutting edges 6 are formed along peripheral ridgelines of wall surfaces facing the leading side in the tool rotational direction T, and the wall surfaces become rake faces thereof. Further, gashes 3B are formed on the front end side of the flutes 3A. Also in the gashes 3B, end cutting edges 7 are formed along the end side ridgelines of wall surfaces facing the leading side in the tool rotational direction T, and the wall surfaces become rake faces thereof.

The tool attaching portion 4 has an almost columnar shape which is coaxial with the cutting section 3 and has a diameter almost the same as the external diameter of the peripheral cutting edges 6, and is formed so as to consecutively connect with the peripheral raised part at the rear side of the flutes 3A in the cutting section 3. Also, in the tool attaching portion 4, a pair of tool attaching faces 4A is formed evenly spaced across each other from the axis O; wherein the tool attaching faces 4A are parallel to the axis O and parallel to each other, and have a shape in which the outer periphery surface of the tool attaching portion 4 seems to be cut off. The tool attaching portion faces 4A, in this embodiment, communicate with the rear side of a pair of the flutes 3A among the aforementioned four flutes 3A, positioned on the opposite side across each other from the axis O.

Further, the mounting portion 5 has an external diameter smaller than that of the tool attaching portion 4, and the external diameter gradually decreases toward the rear end side. In other words, the mounting portion 5 is in a shape of a frustum around the axis O as the central axis thereof. A stepped face 5A with an annulus shape, is positioned between the tool attaching portion 4 and the mounting portion 5, faces the rear end side, and is perpendicular to the axis O. Also, an attaching hole, not shown in the FIGURE, extends from the rear end face of the mounting portion 5 toward the front end side to an inside position of the tool attaching portion 4 or the cutting section 3, and is positioned around the axis O as the central axis thereof.

The connection member 2 comprises:
a shaft portion, not shown in the FIGURE, to be fixed by being inserted into the attaching hole; and
the screw portion 2A as a male screw portion with a diameter larger than that of the shaft portion and smaller than that of the rear end face of the mounting portion 5.

For example, Unexamined Patent Application Publication JP 2011-143532A teaches how to fix the connection member 2 into the attaching hole, wherein:
a through-hole from the shaft portion to the screw portion 2A along the axis O is open in the connection member 2;
a stepped face on the front side of the screw portion 2A and the rear end face of the attaching portion 5 are made to abut each other;
the shaft portion is inserted and fitted into the attaching hole;
a punch is driven into the through-hole from the rear end side;
the shaft portion is plastically-deformed so that the diameter of the shaft portion increases; and
then the connection member 2 is fixed into the attaching hole.

Surfaces of the cutting section 3 and the tool attaching portion 4, in the head body 1, are coated with a coating film. The coating film comprises metal carbide, metal nitride, metal oxide, metal carbonitride or metal boride. These metal compounds contain transition elements such as Ti, Al, V, Cr, Zr and Hf selected from the groups 4a, 5a and 6a on the periodic table, and one or two element(s) selected from the group 3b and/or the group 4b. Typically, the coating film is a high melting point hard material film, for example TiN, TiCN, AlTiN, AlCrN, AlTiSiN, AlCrSiN and TiSiN, and is deposited onto the surface with a desired film thickness using a physical vapor deposition (PVD) method, such as an ion plating method or a sputtering method. Especially, coating by an arc ion plating method is preferable.

On the surface of the coating film just formed by the above methods, especially in a case formed by an arc ion plating method, there will be droplets or macro particles derived from the high melting point hard material, having convex shapes, with a size of about 0.3 µm to 5.0 µm. In other words, the surface of the coating film is rough. Thus, in this embodiment, by partially eliminating the droplets or the macro particles having convex shapes only from the coating film over the tool attaching face 4A, a smooth face can be formed. On the smooth face, the number of droplets or macro particles having convex shapes with a size of 0.3 µm to 5.0 µm, is 200 or less, per area of 40 µm×60 µm.

For forming such a smooth face, various tools and methods, for example a brush containing abrasive grains, abrasive cloths, buffing, polishing, lapping, and abrasive blasting in which shot grains such as fine diamond grains are blasted by pressurized fluid, are used. For instance, when smoothing the tool attaching face 4A with abrasive blasting, other portions, namely, the flute 3A of the cutting edge section 3, the inner face including the aforementioned rake face of the gash 3B, the peripheral cutting edge 6, and a relief of the front end cutting edge 7, may also be smoothed so as to have the same smooth face. However, on the mounting portion 5, its rear end face, its outer periphery face and its inner periphery side from the stepped face 5A, are not coated with the coating film.

Using the connection member 2, the replaceable machining head having the aforementioned structure is detachably and attachably mounted on the front end of the columned tool body (holder), and then the cutting edge section 3 of the head body 1 machines a work piece. The front end portion of the tool body provides, an abutting face for abutting against the stepped face 5A, a tapered hole which extends from the abutting face toward the rear end side of the tool body and has a diameter gradually decreasing toward the rear end side, and a female screw portion formed on the hole bottom of the tapered hole. By screwing the screw portion 2A as a male screw into the aforementioned female screw portion, the mounting portion 5 is tightly fitted into the tapered hole, and the stepped face 5A abuts the abutting face. Then, the replaceable machining head is fixed on the front end portion of the tool body.

Further, when screwing the screw portion 2A of the connection member 2 into the female screw portion of the tool body or when unscrewing the screw portion 2A to detach the replaceable machining head from the tool body, while being slid onto the tool attaching faces 4A, a pair of engaging faces on a jaw portion with a square bracket shape of the working tool such as a wrench or a spanner, becomes closer to each other. The working tool is attached to the tool attaching portion 4, and then the head body 1 is rotated on the axis O together with the connection member 2. In the replaceable machining head with the aforementioned structure, the number of droplets or macro particles having convex shapes with a size of 0.3 µm to 5.0 µm, is lowered to 200 or less, per area of 40 µm×60 µm on the coating film covering the tool attaching faces 4A. Therefore, wear of the working tool caused by the droplets or the macro particles can be minimized.

That is to say, since the droplets or the macro particles having convex shapes on the coating film covering the tool attaching faces 4A are high melting point hard materials, the same as the coating film, whenever attaching the working tool, which is made from a metal material such as steel typically and has a lower hardness than that of the high melting point hard material, to the tool attaching portion 4, the engaging faces on the jaw portion having a square bracket shape come in contact with the coating film over the tool attaching faces 4A. Therefore, by attaching and detaching the replaceable machining heads repeatedly, the engaging faces of the working tool are worn out. Eventually, a large gap develops between the engaging faces and the tool attaching faces 4A. Since the large gap causes instability between them, it becomes impossible to firmly attach the working tool to the tool attaching portion 4.

On the other hand, in the replaceable machining head with the aforementioned structure, the droplets or the macro particles are treated with the aforementioned methods such as polishing. Thereafter, they decrease and are almost removed. Thus, the remnants of the removed droplets or macro particles are merely left as concave portions on the surface of the coating film. Since it becomes possible to minimize wear of the working tool, the replaceable machining head can be attached and detached securely and stably in the long term. Although the droplets or the macro particles have been removed, the surface of the tool attaching faces 4A is covered with the hard coating film. Therefore the tool attaching portion 4 does not suffer damage such as fractures when attaching a working tool thereto.

Also, when attaching the working tool to the tool attaching portion 4, the engaging faces of the working tool are slid onto the tool attaching faces 4A. Since the tool attaching faces 4A are slippery, the frictional resistance arising in sliding decreases. For example, when attaching the replaceable machining head to the tool body, the replaceable machining head is placed on the front end of the tool body. In this situation, even when the working tool is attached to the tool attaching portion 4 to turn the working tool, a high level of friction sufficient to grasp the tool attaching faces 4A and to push them out does not arise between the engaging faces and the tool attaching faces 4A, and then, the replaceable machining head is prevented from suffering any damages caused by falling off from the tool body. Further, as aforementioned, by concurrently performing the works, namely, polishing the cutting edge section 3 and removing the droplets or the macro particles from the tool attaching faces 4A, the labor and time for production can be reduced and thus the cost can also be prevented from increasing.

Here, if the number of droplets or macro particles having convex shapes with a size of 0.3 µm to 5.0 µm, is 200 or more, per area of 40 µm×60 µm on the coating film over the tool attaching faces 4A, friction of the working tool and resistance arising in attaching it to the tool attaching faces 4A are high, and then it becomes difficult to obtain the aforementioned good effects. Also, the lower the number of droplets or macro particles, the more desirable it is. A case, in which the droplets or the macro particles having convex shapes almost do not exist on the surface of the coating film, is highly desirable. However, the work of polishing for removing the droplets or the macro particles to acquire such surface conditions, require huge amounts of time and labor. Therefore, the number of droplets or macro particles being lowered to about 28, is sufficient for actual use.

In this embodiment, a pair of the tool attaching faces 4A is formed in the tool attaching portion 4. For example, other configurations, in which two or more pairs of attaching faces 4A formed in the tool attaching portion 4, are also usable. In these configurations, a cross section perpendicular to the axis O appears as a square or a hexagon, and the attaching faces 4A are placed on each side of a line of the square or the hexagon.

BEST MODE OF CARRYING OUT THE INVENTION

By referring to the modes for the invention and comparative examples, advantageous effects of the present invention are detailed in the following descriptions. In modes for the invention regarding the replaceable machining head shown in FIG. 1, the surface of the head body 1 made of cemented carbide, except for the surface of the mounting portion 5 and the stepping face 5A, was coated with a coating film of AlTiN so as to have a thickness of 2 μm on average by an arc ion plating method. After coating, abrasive blasting was performed by applying fine diamond grains to the coating film for removing the droplets or the macro particles therefrom. By adjusting the duration of abrasive blasting, the replaceable machining head (mode 1) was produced. Regarding the mode 1, the number of droplets or macro particles having convex shapes with a size of 0.3 μm to 5.0 μm, was 43, per area of 40 μm×60 μm on the surface of the coating film over the tool attaching faces 4A. Similarly, by adjusting the duration of abrasive blasting, the replaceable machining head (mode 2) was also produced. Regarding the mode 2, the number of the droplets or the macro particles having convex shapes with a size of 0.3 μm to 5.0 μm, was 178, per area of 40 μm×60 μm on the surface of the coating film over the tool attaching faces 4A.

Additionally, a replaceable machining head, of comparative example 1, was produced. In making this replaceable machining head, work for smoothing the tool attaching faces such as abrasive blasting, was not performed after coating with the same kind of aforementioned coating film. Regarding comparative example 1, the number of droplets or macro particles was 706 per area of 40 μm×60 μm on the tool attaching faces. Furthermore, another replaceable machining head, of comparative example 2, was also produced. In making this replaceable machining head, the duration of abrasive blasting was shorter than that of the mode 2. Regarding comparative example 2, the number of droplets or macro particles having convex shapes with a size of 0.3 μm to 5.0 μm, was 217, per area of 40 μm×60 μm on the surface of the coating film over the tool attaching faces. This number was less than that of the comparative example 1, and was greater than that of the mode 2.

Further, concerning the modes 1 and 2, and the comparative examples 1 and 2, a Scanning Electron Microscope (model number JSM-5410) produced by JEOL Ltd. was used for measuring each number of droplets or macro particles having convex shapes, with sizes from 0.3 μm to 5.0 μm, per area of 40 μm×60 μm on the surface of the coating film over the tool attaching face. Also, the surface size of the tool attaching face was 10 mm×4 mm, the distance between one tool attaching face and the other tool attaching face on the opposite side was 16 mm, and the screw portion had a screw pitch of 1.5 mm, a screw diameter of 10 mm and a screw length of 10 mm.

Furthermore, in order to test an occurrence of instability caused by wear from engaging faces of a wrench:

a wrench made of chromium molybdenum steel was attached to each tool attaching portion of the modes 1 and 2, and the comparative examples 1 and 2;

the wrench was turned with the maximum torque of 50 N·m; and the operation of attaching and detaching the replaceable machining head to and from the tool body, was carried out repeatedly.

As the result of the test, concerning the comparative example 1, the instability occurred at an early stage. After about 700 cycles of attaching and detaching, the wrench and the tool attaching portion did not engage well with each other, and then it became difficult to perform attaching and detaching the replaceable machining head.

Concerning the comparative example 2, although it was possible to repeat the cycles of attaching and detaching which were performed more times than in the comparative example 1, it became difficult to perform attaching and detaching the replaceable machining head after about 800 cycles.

On the other hand, concerning the modes 1 and 2, the cycles of attaching and detaching which were performed more times than in the comparative example 2, did not bring about an occurrence of the instability. The cycles of attaching and detaching had been repeated 1000 times, and then the test was finished. Up to the end of the test, no instability was observed.

Further, after the above test, by watching the wrenches carefully, no frictional wear was found concerning the mode 1, and very slight abrasion was found concerning the mode 2. Consequently, the number of droplets or macro particles having convex shapes with a size of 0.3 μm to 5.0 μm, should be desirably 100 or less, per area of 40 μm×60 μm on the surface of the coating film over the tool attaching face.

REFERENCE SIGNS LIST

1: HEAD BODY
2: CONNECTION MEMBER
2A: SCREW PORTION
3: CUTTING EDGE SECTION
3A: FLUTE
3B: GASH
4: TOOL ATTACHING PORTION
4A: TOOL ATTACHING FACE
5: MOUNTING PORTION
5A: STEPPED FACE
6: PERIPHERAL CUTTING EDGE
7: FRONT END CUTTING EDGE
O: AXIS OF HEAD BODY 1
T: TOOL ROTATIONAL DIRECTION

The invention claimed is:

1. A replaceable machining head comprising:
a cutting edge section which is formed on the front side of a head body;
a tool attaching portion to which a working tool is to be attached, and which is formed on the rear end side of the cutting edge section; and
tool attaching faces which are formed in the tool attaching portion,
wherein the surface of the head body is coated with a coating film, and
the number of droplets or macro particles having convex shapes with a size of 0.3 μm to 5.0 μm, is 200 or less, per area of 40 μm×60 μm on the surface of the coating film over the tool attaching faces.

* * * * *